United States Patent
Mizukane et al.

(10) Patent No.: US 8,274,843 B2
(45) Date of Patent: Sep. 25, 2012

(54) SEMICONDUCTOR DEVICE HAVING NONVOLATILE MEMORY ELEMENT AND DATA PROCESSING SYSTEM INCLUDING THE SAME

(75) Inventors: Yoshio Mizukane, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 297 days.

(21) Appl. No.: 12/695,784

(22) Filed: Jan. 28, 2010

(65) Prior Publication Data
US 2010/0208528 A1    Aug. 19, 2010

(30) Foreign Application Priority Data
Feb. 18, 2009  (JP) ................................. 2009-035805

(51) Int. Cl.
*G11C 7/10* (2006.01)
*G11C 17/16* (2006.01)
*G11C 7/00* (2006.01)

(52) U.S. Cl. ................. 365/189.05; 365/225.7; 365/191

(58) Field of Classification Search ........................ None
See application file for complete search history.

(56) References Cited

U.S. PATENT DOCUMENTS

| | | | |
|---|---|---|---|
| 5,825,706 A * | 10/1998 | Snowden et al. | 365/222 |
| 7,825,706 B2 | 11/2010 | Smith et al. | |
| 2002/0001239 A1 * | 1/2002 | Mori et al. | 365/200 |
| 2007/0165768 A1 * | 7/2007 | Lee et al. | 377/94 |

FOREIGN PATENT DOCUMENTS

JP    8-96594    4/1996

OTHER PUBLICATIONS

Mizukane et al., U.S. Office Action mailed Mar. 2, 2012 directed to U.S. Appl. No. 12/797,948; 14 pages.

* cited by examiner

*Primary Examiner* — Hoai V Ho
*Assistant Examiner* — James G Norman
(74) *Attorney, Agent, or Firm* — Morrison & Foerster LLP

(57) ABSTRACT

A semiconductor device includes a fuse element, a read-out circuit that reads out a memory content of the fuse element in response to a first internal reset signal that is activated in response to transition of an external reset signal, and a latch circuit that holds therein the memory content read out by the read-out circuit and is reset by a second internal reset signal that is activated based on an activation period of the external reset signal. With this configuration, even when the activation period of the external reset signal is long, the time for which a current flows through the fuse element can be shortened, thereby making it possible to reduce a current consumption at the time of a reset operation.

19 Claims, 16 Drawing Sheets

SEMICONDUCTOR DEVICE HAVING NONVOLATILE MEMORY ELEMENT AND DATA PROCESSING SYSTEM INCLUDING THE SAME

BACKGROUND OF THE INVENTION

1. Field of the Invention

The present invention relates to a semiconductor device, and more particularly relates to a semiconductor device of which an operation is controlled according to information stored in a nonvolatile memory element such as a fuse. The present invention further relates to a data processing system including the semiconductor device.

2. Description of Related Art

In a semiconductor device such as a DRAM (Dynamic Random Access Memory), a nonvolatile memory element is provided for a replacement of a defect address or an internal operation switching. The nonvolatile memory element includes an antifuse element that is electrically programmable and a laser fuse element that can be blown (disconnected) by an application of a laser beam. Information written in the nonvolatile memory element is read out by a readout signal, and it is stored in a latch circuit (see Japanese Patent Application Laid-open No. H8-96594).

Meanwhile, in some semiconductor devices such as a DDR3 (Double Data Rate 3) DRAM, a reset terminal is provided as an external terminal. An external reset signal is supplied to the reset terminal. When the external reset signal is activated, the latch circuit is reset and the information written in the nonvolatile memory element is read out. With this operation, information written in the nonvolatile memory element is correctly loaded to the latch circuit, and thereafter a semiconductor device is initialized. The reset signal is activated at the time of startup and at an arbitrary timing during the operation.

However, an application of a fuse circuit disclosed in Japanese Patent Application Laid-open No. H8-96594 to a semiconductor device including the above reset terminal can cause the following problem.

In Japanese Patent Application Laid-open No. H8-96594, a flip-flop 4 is reset in response to activation of a signal YRD from an ATD signal generating circuit 2, and a selected fuse F is read out across a period during which a signal YRDB is activated. According to this conventional technique, the fuse F is constantly read out in the period during which the signal YRDB is activated. At this time, as long as the selected fuse is in an electrically conductive state, a current keeps on flowing from a power source to a ground.

Accordingly, if the fuse circuit described in Japanese Patent Application Laid-open No. H8-96594 is applied to a semiconductor device including a reset terminal, a current keeps on flowing through an unblown (connected) fuse element across a period during which an external reset signal is activated. As a result, there is a problem that, for example, when the external reset signal is activated in a state that a low current consumption is required, such as a deep power down mode of a DRAM, the current consumption exceeds its regulated value.

SUMMARY

In one embodiment, there is provided a semiconductor device that includes a timing control circuit that activates a first internal reset signal in response to transition of an external reset signal and activates a second internal reset signal based on an activation period of the external reset signal, a nonvolatile memory element, a read-out circuit that reads out a memory content of the nonvolatile memory element in response to the first internal reset signal and a first latch circuit that holds therein a memory content read out by the read-out circuit and that is reset by the second internal reset signal.

In another embodiment, there is provided a data processing system that includes the semiconductor device described above and a controller that issues the external reset signal to the semiconductor device. The controller activates the external reset signal at least when a power is applied to the semiconductor device.

According to the present invention, the nonvolatile memory element is read out in response to transition of the external reset signal. Therefore, even when an activation period of the external reset signal is lengthened, the problem of a current flowing through the nonvolatile memory element is negligible. As a result, the current consumption at the time of reset can be reduced.

Furthermore, because the latch circuit that stores a memory content read out from the nonvolatile memory element is reset based on the activation period of the external reset signal, a period during which the output of the latch circuit is unstable becomes minimized. As a result, the possibility of malfunctioning of another internal circuit that uses the output of the latch circuit can be eliminated.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
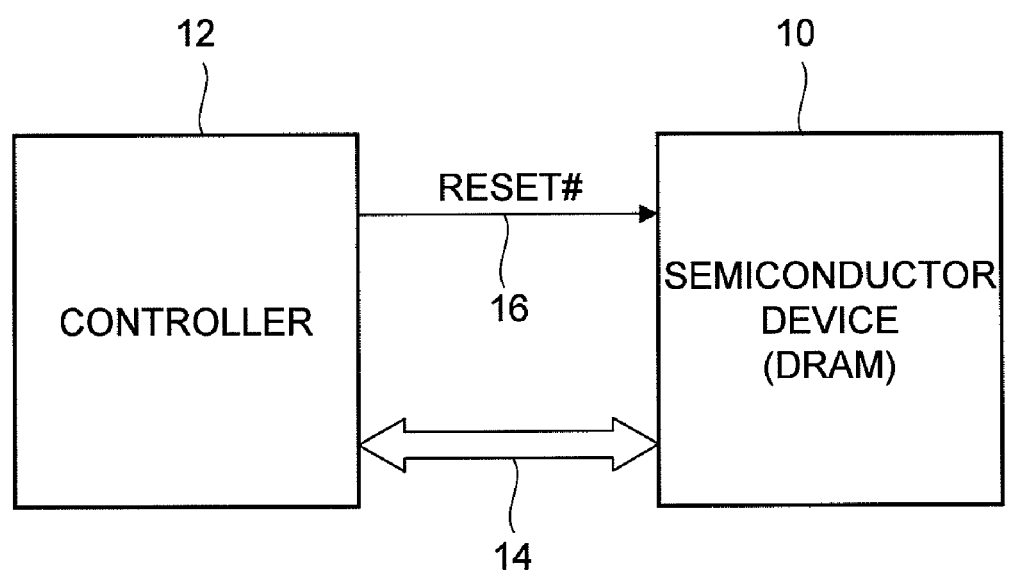
FIG. 1 is a block diagram of a data processing system according to an embodiment of the present invention.

FIG. 1 is a block diagram of a data processing system according to an embodiment of the present invention.

The data processing system shown in FIG. 1 is configured with a semiconductor device 10 and a controller 12 that controls the semiconductor device 10. Although not particularly limited, the semiconductor device 10 is a DDR3 (Double Data Rate 3) DRAM (Dynamic Random Access Memory). The controller 12 supplies signals such as an address, a command, and a clock to the semiconductor device 10 that is a DRAM via a bus 14, and at the same time, performs an output of write data and an input of read data.

The command issued by the controller 12 includes an external reset signal RESET#. The external reset signal RESET# is a signal for resetting the semiconductor device 10, and in this embodiment, the Low level is an activation state of the external reset signal RESET#. Therefore, in a normal operation, the external reset signal RESET# is maintained to the High level, and is activated to the Low level for a predetermined period at the time of power on or restart. The external reset signal RESET# is not a signal that is expressed with a combination a plurality of signals (RAS, CAS, and the like), such as an active command or a read command, but a single signal that is supplied to the semiconductor device 10 from the controller 12 via a dedicated line 16.

A timing at which the controller 12 activates the external reset signal RESET# is the time of powering on the semiconductor device 10. However, not only at the time of powering on the semiconductor device 10, but also at the time of normal state after powering on the semiconductor device 10, the controller 12 can restart the semiconductor device 10 by activating the external reset signal RESET# at an arbitrary timing.

Figure 2:
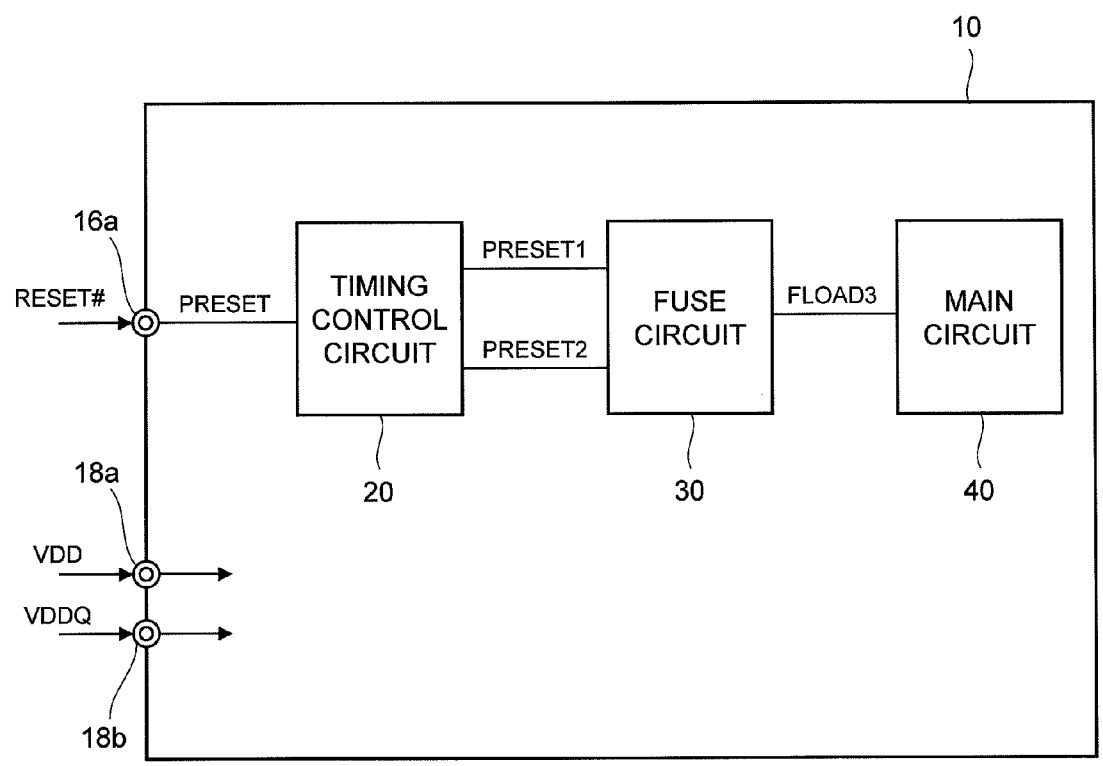
FIG. 2 is a block diagram of the semiconductor device 10 according to a first embodiment of the present invention.

FIG. 2 is a block diagram of the semiconductor device 10 according to a first embodiment of the present invention.

As shown in FIG. 2, the semiconductor device 10 according to the first embodiment includes a timing control circuit 20, a fuse circuit 30, and a main circuit 40. The main circuit 40 is a circuit block for realizing main functions of the semiconductor device 10, and when the semiconductor device 10 is a DRAM as is the case of the first embodiment, the main circuit 40 is corresponding to a memory core and its peripheral circuits. The peripheral circuits indicate circuit blocks including an address buffer, an address decoder, a command decoder, a refresh counter, a clock control circuit, and a data input/output circuit.

The timing control circuit 20 is connected to a reset terminal 16a to which the external reset signal RESET# is input. The timing control circuit 20 generates internal reset signals PRESET1 and PRESET2 based on an internal reset signal PRESET that is an internal signal of the external reset signal RESET#. The internal reset signals PRESET1 and PRESET2 are supplied to the fuse circuit 30.

The fuse circuit 30 generates a control signal FLOAD3 based on the internal reset signals PRESET1 and PRESET2. The control signal FLOAD3 is supplied to the main circuit 40. An operation mode of the main circuit 40 is designated based on the control signal FLOAD3. The fuse circuit 30 is set at the time of manufacturing the semiconductor device 10, based on the specifications and the like. That is, the setting information of the fuse circuit 30 is irreversible and cannot be changed after manufactured.

The semiconductor device 10 further includes power source terminals 18a and 18b as external terminals. A power source voltage VDD is supplied to the power source terminal 18a. The power source voltage VDD applied to the power source terminal 18a is supplied to various circuits included in the main circuit 40 directly or after being stepped up or down by a power supply circuit. A power source voltage VDDQ is supplied to the power source terminal 18b. The power source voltage VDDQ is used as an operation voltage of an output buffer (not shown) included in the main circuit 40.

Figure 3:
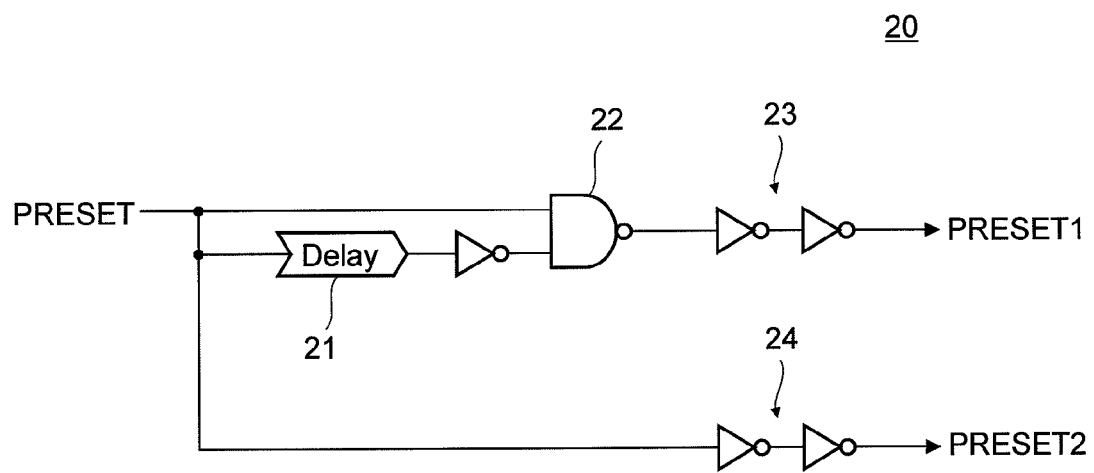
FIG. 3 is a circuit diagram of the timing control circuit 20.

FIG. 3 is a circuit diagram of the timing control circuit 20.

As shown in FIG. 3, the timing control circuit 20 includes a delay circuit 21 that delays the internal reset signal PRESET and a NAND circuit 22 which receives an inverted output of the delay circuit 21 and the internal reset signal PRESET. The internal reset signal PRESET is an internal signal of the external reset signal RESET# that is supplied to the reset terminal 16a, which has a slight phase lag with respect to the external reset signal RESET#. The output of the NAND circuit 22 is supplied to an inverter row 23 of even-numbered stages from which the internal reset signal PRESET1 is output. The internal reset signal PRESET is input to an inverter row 24 of even-numbered states from which the internal reset signal PRESET2 is output.

Figure 4:
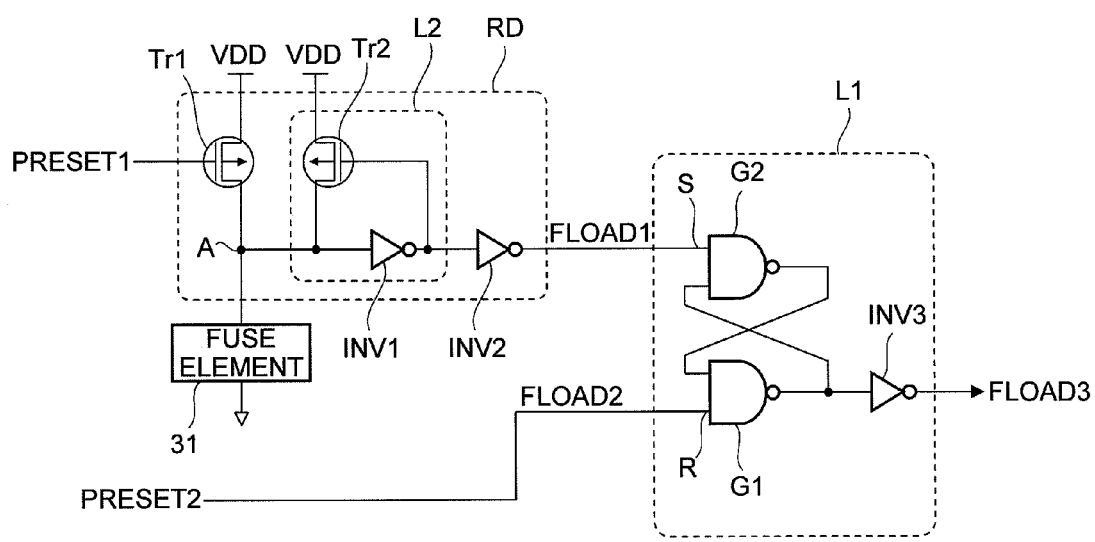
FIG. 4 is a circuit diagram of the fuse circuit.

FIG. 4 is a circuit diagram of the fuse circuit 30.

As shown in FIG. 4, the fuse circuit 30 includes a fuse element 31, a read-out circuit RD, and a latch circuit L1. The fuse element 31 is a nonvolatile memory element that is configured to be blown (disconnected) by an irradiation of a laser beam (a laser fuse). Therefore, the fuse element 31 is in an electrically conductive state before it is irradiated with the laser beam, and by the irradiation of the laser beam, it is blown to be in an electrically nonconductive state. The change of the state of the fuse element 31 is irreversible, so that the fuse element 31 that is once blown cannot be returned to the conductive state. Although not particularly limited, the laser beam is irradiated on a wafer state at the time of manufacturing the semiconductor device 10.

The read-out circuit RD reads out information from the fuse element 31 in response to the internal reset signal PRESET1. The read-out circuit RD includes transistors Tr1 and Tr2 and an inverter INV1. The transistors Tr1 and Tr2 are connected in parallel to each other and connected to the fuse element 31 in series. The input terminal of the inverter INV1 is connected to a connection point A of the transistors Tr1 and Tr2 and the fuse element 31. The output terminal of the inverter INV1 is connected to the gate electrode (a control electrode) of the transistor Tr2. Both of the transistors Tr1 and Tr2 are P-channel MOS transistors. The internal reset signal PRESET1 is supplied to the gate electrode of the transistor Tr1.

With this configuration, when the internal reset signal PRESET1 is activated to the Low level, the transistor Tr1 is switched ON, and then the voltage VDD is applied to the fuse element 31. When the fuse element 31 is in a conductive state (which means that it is not blown by the laser beam), the ON current of the transistor Tr1 flows to the ground via the fuse element 31, setting the potential of the connection point A to the Low level. On the other hand, when the fuse element 31 is in a nonconductive state (which means that it is blown by the laser beam), the current does not flow through the fuse element 31 even when the transistor Tr1 is switched ON, setting the potential of the connection point A to the High level. The logical level of the connection point A is held in a latch circuit L2 that is configured with the transistor Tr2 and the inverter INV1, and it output via an inverter INV2. In FIG. 4, the output of the read-out circuit RD is described as a control signal FLOAD1.

The latch circuit L1 is an SR latch circuit that is configured with two NAND circuits G1 and G2 that are connected to each other in a circulating manner. A control signal FLOAD2 is supplied to a reset input terminal R of the latch circuit L1. The control signal FLOAD2 is the same as the internal reset signal PRESET2; however, it has a slight phase lag with respect to the internal reset signal PRESET2 due to a delay caused by propagation of the signal.

Therefore, when the internal reset signal PRESET2 is activated to the Low level, the output of the latch circuit L1 is forcibly set to the Low level via an inverter INV3. Meanwhile, the output of the read-out circuit RD is supplied to a set input terminal S of the latch circuit L1. When the output of the read-out circuit RD is set to the Low level in a state that the internal reset signal PRESET1 is not activated (High level), the control signal FLOAD3, which is the output of the latch circuit L1, is set to the High level via the inverter INV3. The information latched in the latch circuit L1 is held until the control signal FLOAD2 is activated.

The configuration of the semiconductor device 10 according to the first embodiment is as described above. The operation of the semiconductor device 10 is explained next.

Figure 5:
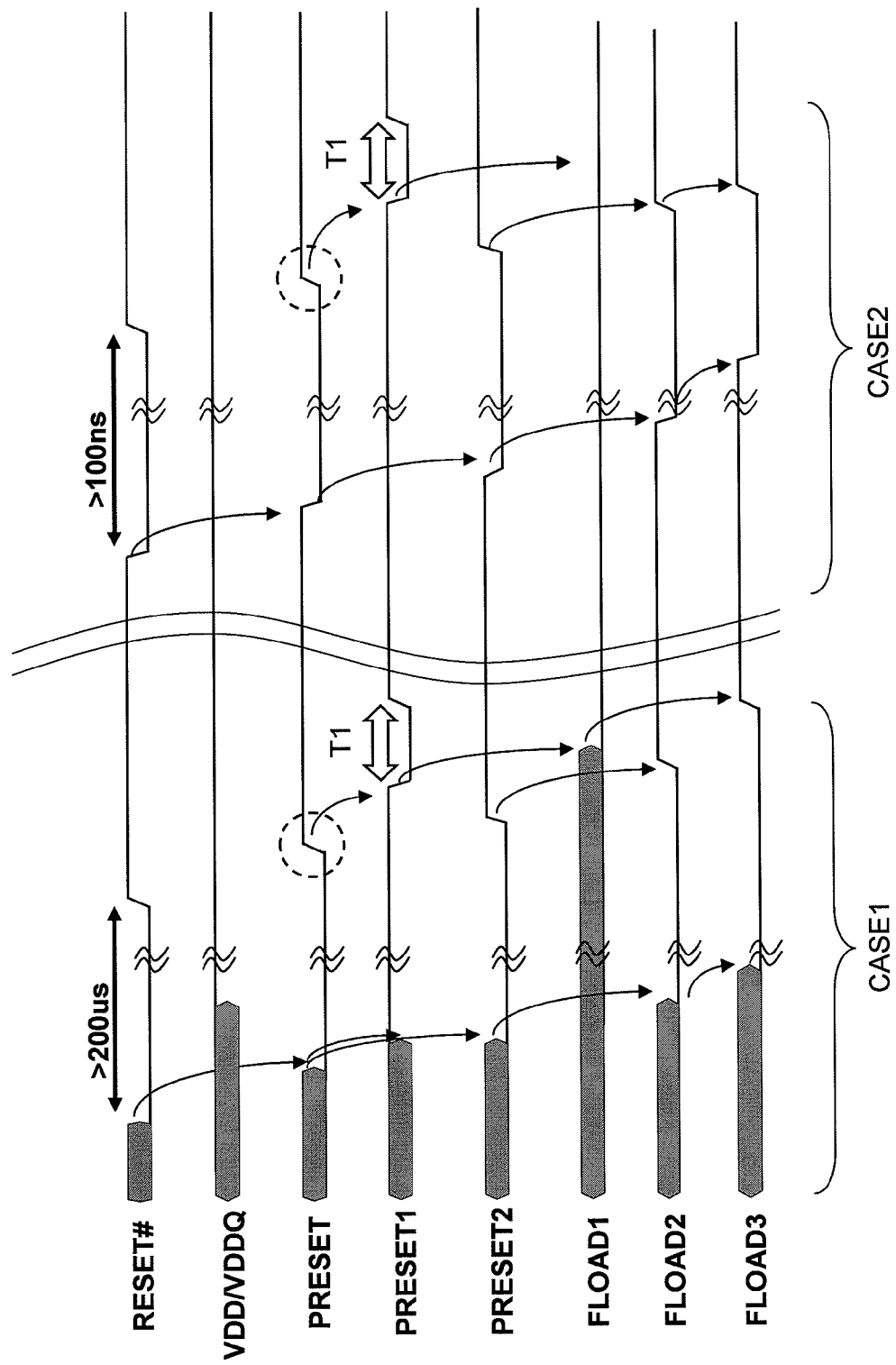
FIG. 5 is a timing chart for explaining the operation of the semiconductor device according to the first embodiment.

FIG. 5 is a timing chart for explaining the operation of the semiconductor device 10 according to the first embodiment. The example shown in FIG. 5 shows the operations when the external reset signal RESET# is activated at a CASE1, which is a case at the time of turning on the power and a CASE2, which is a steady state after turning on the power.

As shown in FIG. 5, the external reset signal RESET# is activated for a period of 200 microseconds (μsec) or longer at the CASE1 that means turning on the power, and for a period of 100 nanoseconds (nsec) or longer at the CASE2 that means the steady state after turning on the power. The reason why the activation period of the external reset signal RESET# is set to a longer time at the CASE1 is because the power source voltages VDD and VDDQ are not stable at the time of turning on the power, which requires a sufficient time for a reset operation in a proper manner. On the contrary, in the steady state after turning on the power, the power source voltages VDD and VDDQ are stable, so that the reset operation can be securely performed in a short time.

In both of the CASE1 and the CASE2, when the external reset signal RESET# is activated to the Low level, the internal reset signals PRESET and PRESET2 are also activated in conjunction with the activation of the external reset signal RESET#. However, due to a predetermined propagation time caused by propagating through the inverter row 24 shown in FIG. 3 and the like, the phase of the internal reset signal PRESET is slightly retarded with respect to the external reset signal RESET#, and the phase of the internal reset signal PRESET2 is slightly retarded with respect to the internal reset signal PRESET.

On the other hand, the internal reset signal PRESET1 is activated to the Low level only for a predetermined period T1 in response to a rising edge of the internal reset signal PRESET. The predetermined period T1 is determined by the delay amount of the delay circuit 21 shown in FIG. 3. The predetermined period T1 is set shorter enough than the activation period of the external reset signal RESET#. When the activation period of the external reset signal RESET# is 100 nsec in the steady state, it is preferable to set the predetermined period T1 to about 1 nsec. However, when the predetermined period T1 is too short, the read-out circuit RD may not read out in a proper manner. Therefore, it is preferable to make a design such that the predetermined period T1 should be 2 nsec or longer.

With this configuration, when the external reset signal RESET# is activated, the internal reset signal PRESET2 (=the control signal FLOAD2) is activated for the same period as the activation period of the external reset signal RESET#. After that, when the external reset signal RESET# makes transition from an activation state to a deactivation state, the internal reset signal PRESET1 is activated for the predetermined period T1 in response to the deactivation of the external reset signal RESET#.

As a result, for the activation period of the control signal FLOAD2, the control signal FLOAD3, which is the output of the fuse circuit 30, is fixed to the Low level because the latch circuit L1 included in the fuse circuit 30 is forcibly reset. After that, when the internal reset signal PRESET1 is activated for the predetermined period T1, the read-out circuit RD performs reading of the memory content of the fuse element 31, and then the logical level of the control signal FLOAD1 is determined based on the result of the reading. Therefore, if the fuse element 31 is blown, the control signal FLOAD1 becomes the Low level, and the latch circuit L1 is set. Finally, the control signal FLOAD3, which is the output of the fuse circuit 30, is changed to the High level. On the other hand, if the fuse element 31 is not blown, the control signal FLOAD1 becomes the High level, and then the control signal FLOAD3, which is the output of the fuse circuit 30, is maintained to the Low level. In the example shown in FIG. 5, waveforms of the signals are shown in the case that the fuse element 31 is blown.

From the above operations, when the external reset signal RESET# is activated, the memory content of the fuse element 31 is read out, the logical level of the control signal FLOAD3, which is the output of the fuse circuit 30, is determined based on the memory content of the fuse element 31.

In the first embodiment, the period T1 for which a current flows through the fuse element 31 is determined by the activation period of the internal reset signal PRESET1 regardless of the activation period of the external reset signal RESET#. Therefore, a current consumption due to the current flowing through the fuse element 31 can be suppressed. Particularly, even when the activation period of the external reset signal RESET# is long as in the case of the CASE1, which is the case at the time of powering on the semiconductor device 10, the period for which the current flows through the fuse element 31 is fixed to the predetermined period T1; and therefore, the current consumption at the time of powering on the semiconductor device 10 can be greatly suppressed.

In addition, in the first embodiment, when the external reset signal RESET# is activated, the latch circuit L1 is promptly reset; and therefore, a period for which the control signal FLOAD3, which is the output of the fuse circuit 30, is unstable can be suppressed to the minimum. As a result, a possibility of causing a malfunction of the main circuit 40 due to an unstable output of the control signal FLOAD3 can also be eliminated.

Figure 6:
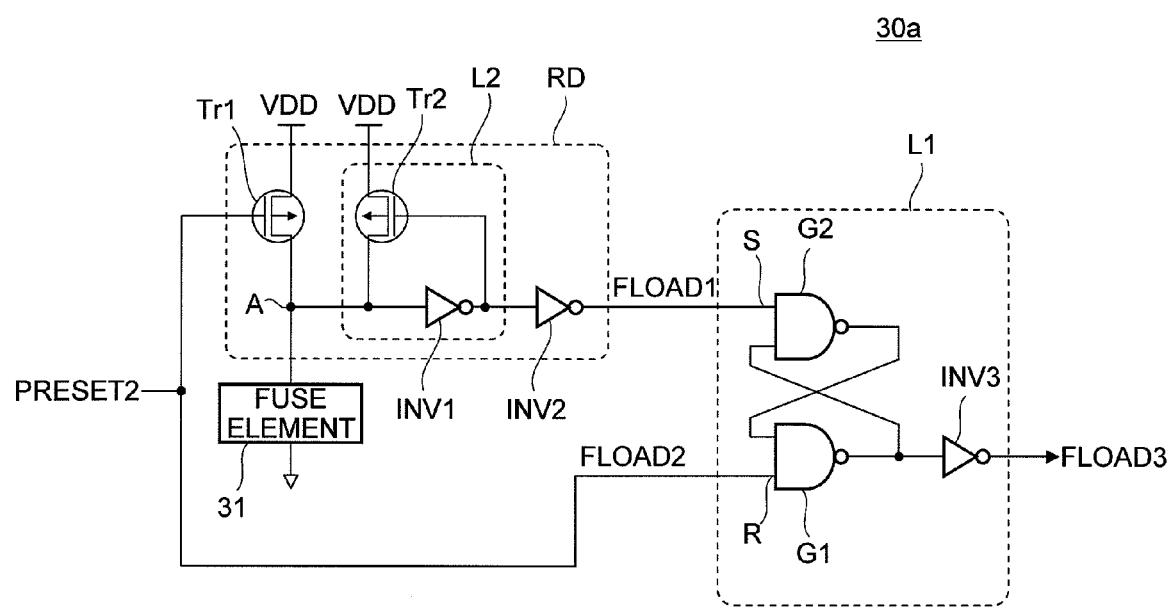
FIG. 6 is a circuit diagram of a first prototype fuse circuit.

FIG. 6 is a circuit diagram of a first prototype fuse circuit 30a.

The fuse circuit 30a shown in FIG. 6 is different from the fuse circuit 30 shown in FIG. 4 in that the internal reset signal PRESET2 is commonly supplied to the gate electrode of the transistor Tr1 and the reset input terminal of the latch circuit L1. That is, the internal reset signal PRESET1 is not used in the fuse circuit 30a.

Figure 7:
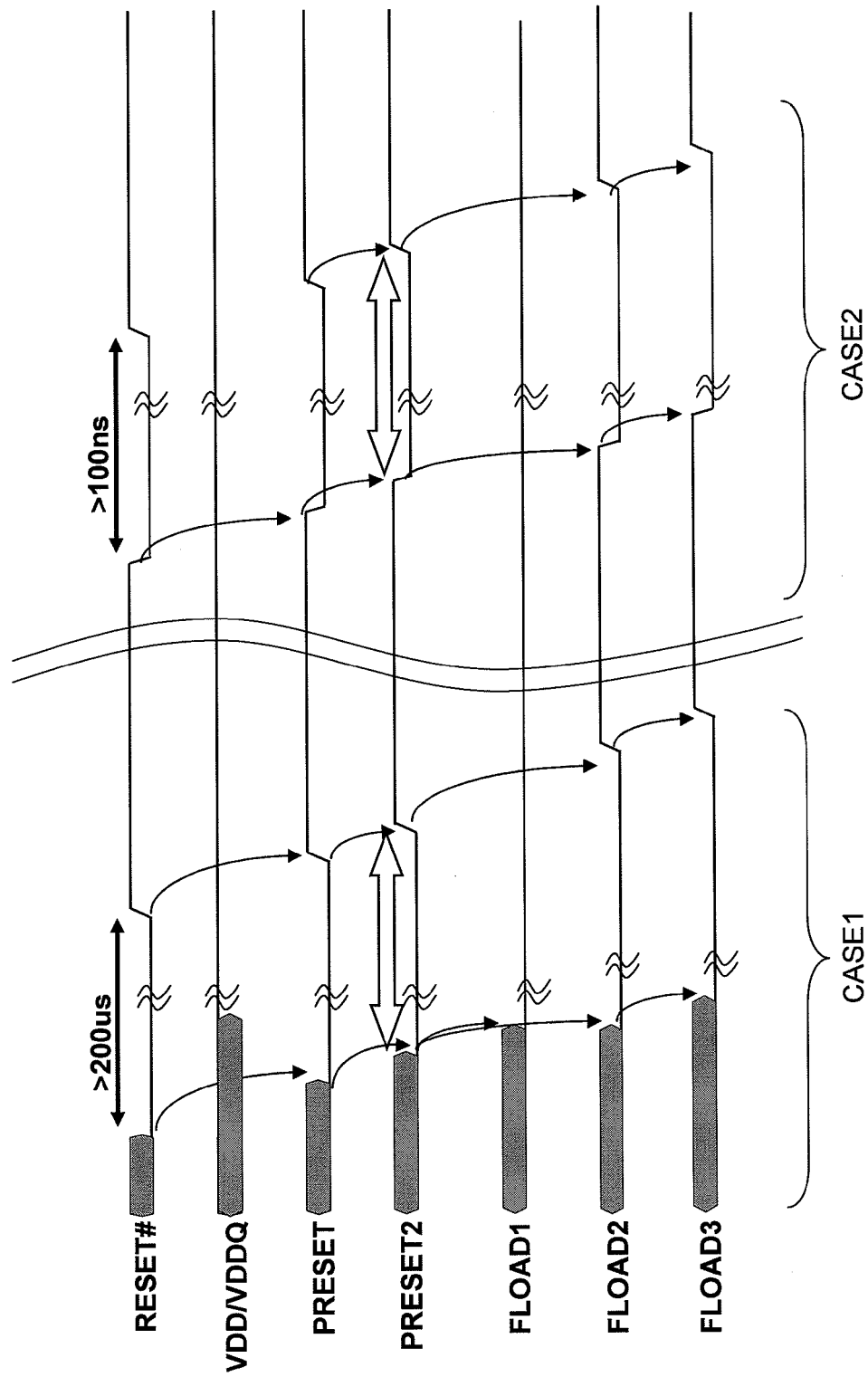
FIG. 7 is a timing chart for explaining the operation of the semiconductor device employing the first prototype fuse circuit.

FIG. 7 is a timing chart for explaining the operation of the semiconductor device 10 employing the first prototype fuse circuit 30a.

As shown in FIG. 7, in the case of employing the first prototype fuse circuit 30a, a current continues to flow through the fuse element 31 for the activation period of the internal reset signal PRESET2. Therefore, particularly in the case that the activation period of the external reset signal RESET# is long, as in the case at the time of powering on the semiconductor device 10, the current continues to flow through the fuse element 31 for a long time, which increases the current consumption.

On the other hand, in the first embodiment, because the current flows through the fuse element 31 only for the predetermined period T1 in response to the transition of the external reset signal RESET# (the rising edge), the problem related to FIGS. 6 and 7 does not occur.

Figure 8:
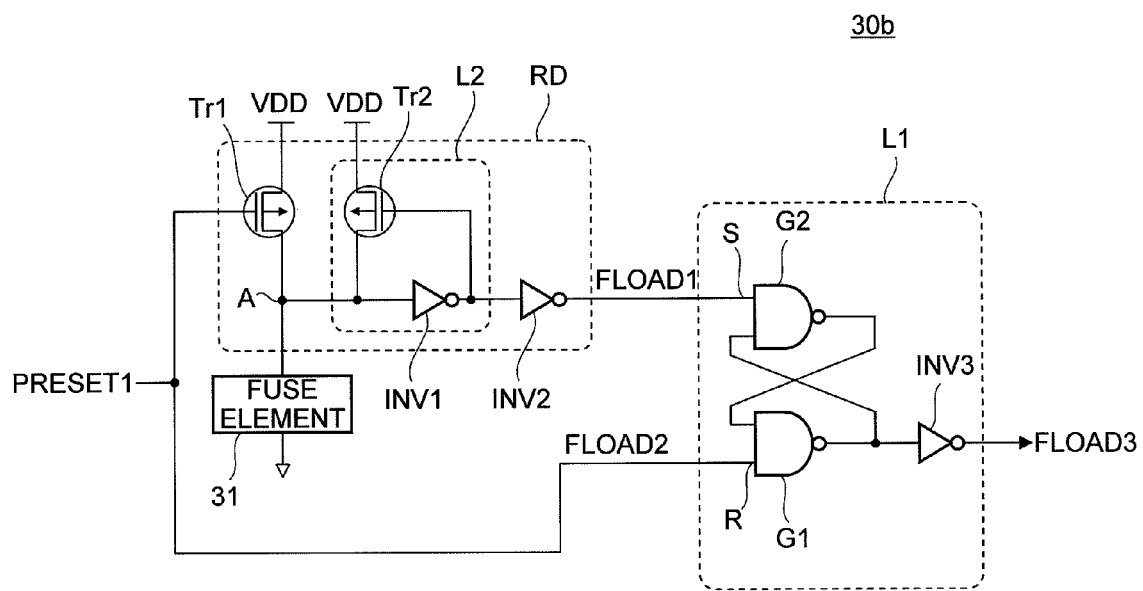
FIG. 8 is a circuit diagram of a second prototype fuse circuit.

FIG. 8 is a circuit diagram of a second prototype fuse circuit 30*b*.

The fuse circuit 30*b* shown in FIG. 8 is different from the fuse circuit 30 shown in FIG. 4 in that the internal reset signal PRESET1 is commonly supplied to the gate electrode of the transistor Tr1 and the reset input terminal of the latch circuit L1. That is, the internal reset signal PRESET2 is not used in the fuse circuit 30*b*.

Figure 9:
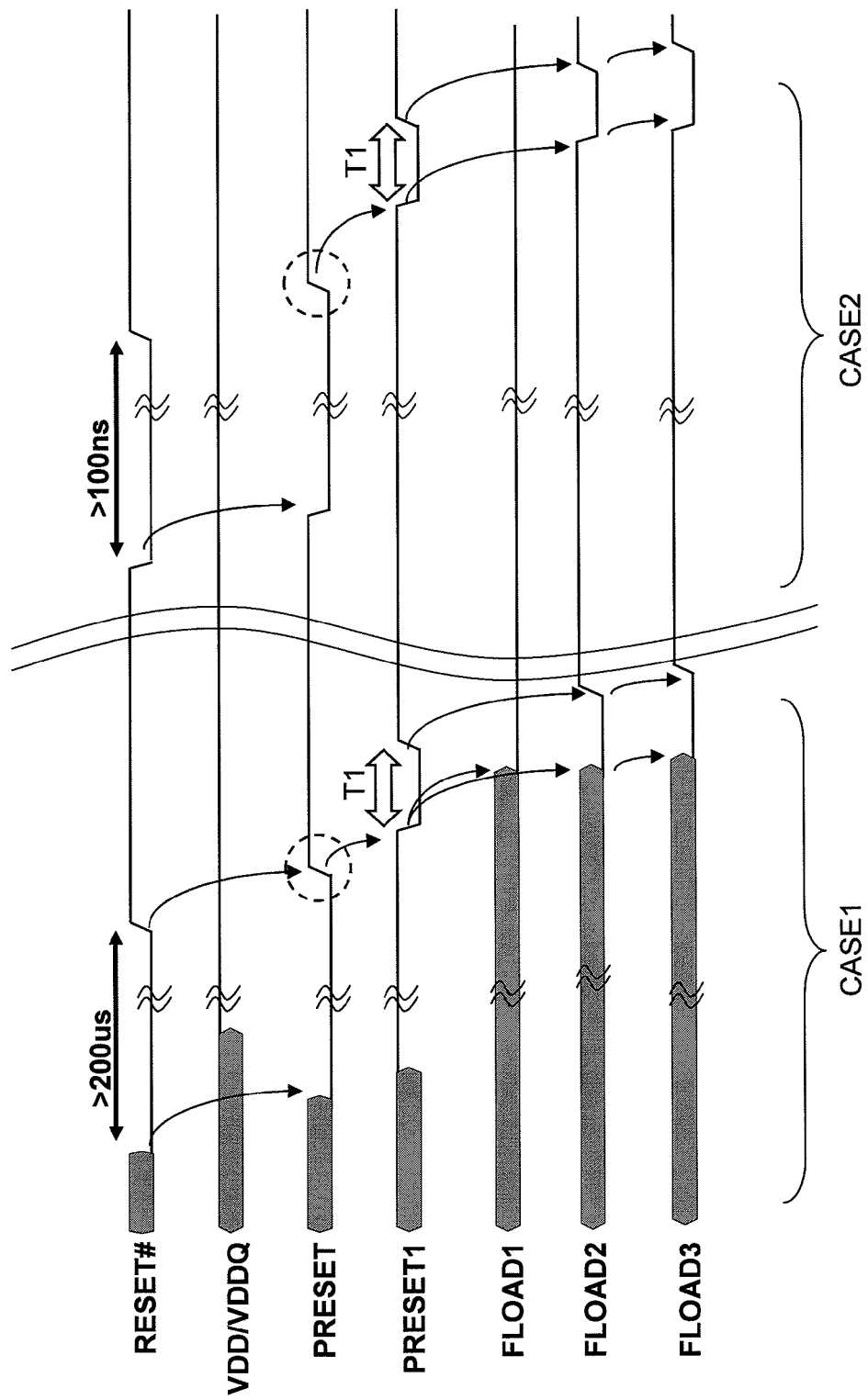
FIG. 9 is a timing chart for explaining the operation of the semiconductor device employing the second prototype fuse circuit.

FIG. 9 is a timing chart for explaining the operation of the semiconductor device 10 employing the second prototype fuse circuit 30*b*.

As shown in FIG. 9, in the case of employing the second prototype fuse circuit 30*b*, the period for which a current flows through the fuse element 31 is limited to the predetermined period T1 for which the internal reset signal PRESET1 is activated, as is the case of the first embodiment. However, the internal reset signal PRESET1 is activated after the external reset signal RESET# is deactivated. Therefore, at the time of powering on the semiconductor device 10, the output of the control signal FLOAD3 becomes unstable until the external reset signal RESET# is deactivated (that is, the period of 200 μsec or longer). As a result, the main circuit depending on the control signal FLOAD3 may malfunction.

On the other hand, in the first embodiment, because the control signal FLOAD3 is fixed to the Low level immediately after the external reset signal RESET# is deactivated, the problem related to FIGS. 8 and 9 does not occur.

As described above, with the semiconductor device 10 according to the first embodiment, it is possible to prevent a malfunction of the main circuit 40 while suppressing the current consumption.

A second embodiment of the present invention is explained next.

Figure 10:
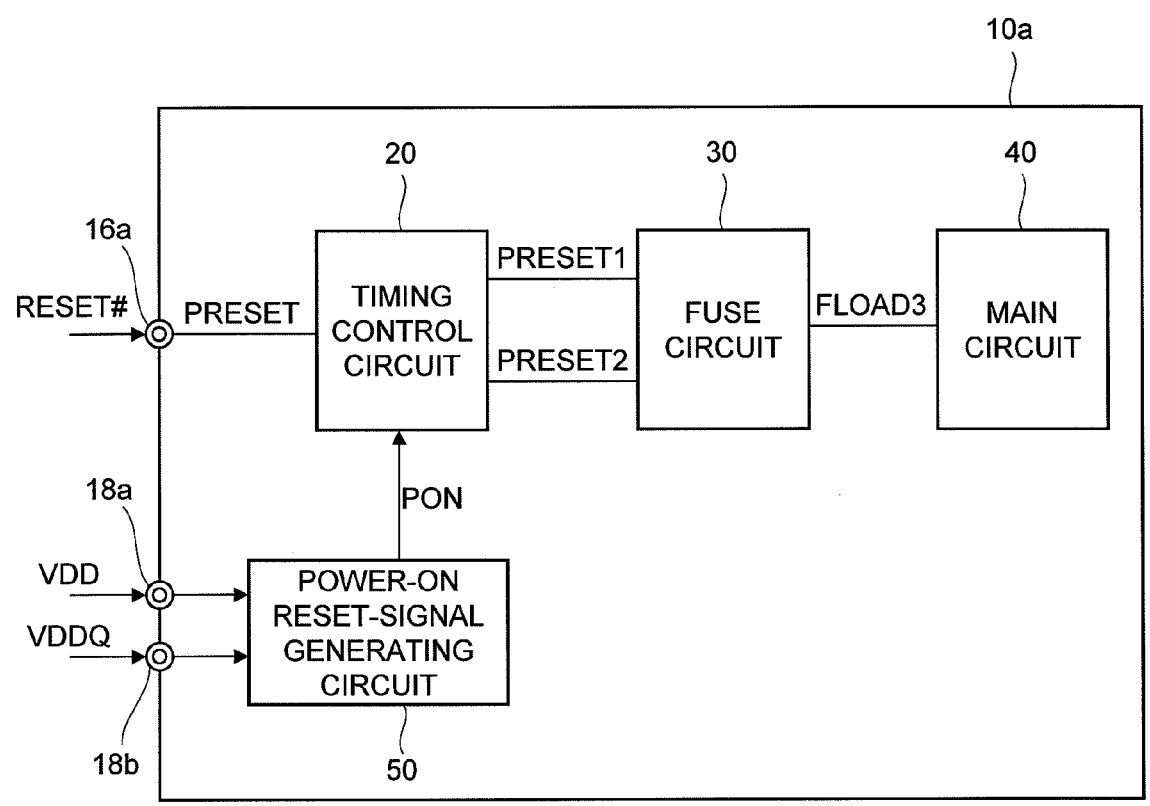
FIG. 10 is a block diagram of a semiconductor device according to the second embodiment.

FIG. 10 is a block diagram of a semiconductor device 10*a* according to the second embodiment.

As shown in FIG. 10, the second embodiment is different from the first embodiment in that the semiconductor device 10*a* further includes a power-on reset-signal generating circuit 50 and the timing control circuit 20 is replaced with a timing control circuit 20*a*. Because other features of the semiconductor device 10*a* are the same as those of the semiconductor device 10, like reference numerals are denoted to like constituent elements and redundant explanations thereof will be omitted.

The power-on reset-signal generating circuit 50 is connected to the power source terminals 18*a* and 18*b*, and detects the power source voltages VDD and VDD1 that are supplied to the power source terminals 18*a* and 18*b*. A power-on reset signal PON, which is the output of the power-on reset-signal generating circuit 50, is set to the High level (virtually the same value as the power source voltage on the rise) right after powering on the semiconductor device 10*a*; however, when the power source voltage is raised up to a predetermined value, the power-on reset signal PON is changed to the Low level, and is fixed to the Low level later on. The power-on reset signal PON is supplied to the timing control circuit 20*a*.

Figure 11:
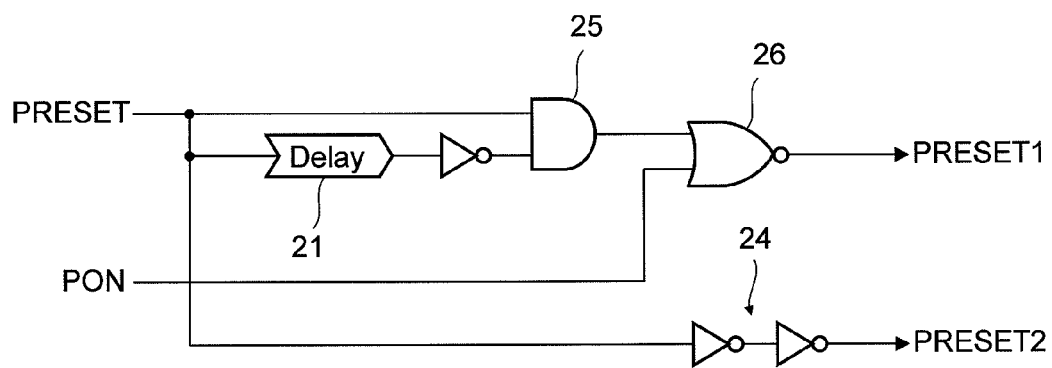
FIG. 11 is a circuit diagram of the timing control circuit.

FIG. 11 is a circuit diagram of the timing control circuit 20*a*.

As shown in FIG. 11, the timing control circuit 20*a* includes an AND circuit 25 which receives an inverted output of the delay circuit 21 and the internal reset signal PRESET and a NOR circuit 26 which receives the output of the AND circuit 25 and the power-on reset signal PON. The output of the NOR circuit 26 is output as the internal reset signal PRESET1. Other features of the timing control circuit 20*a* are the same as those of the timing control circuit 20 shown in FIG. 3.

Figure 12:
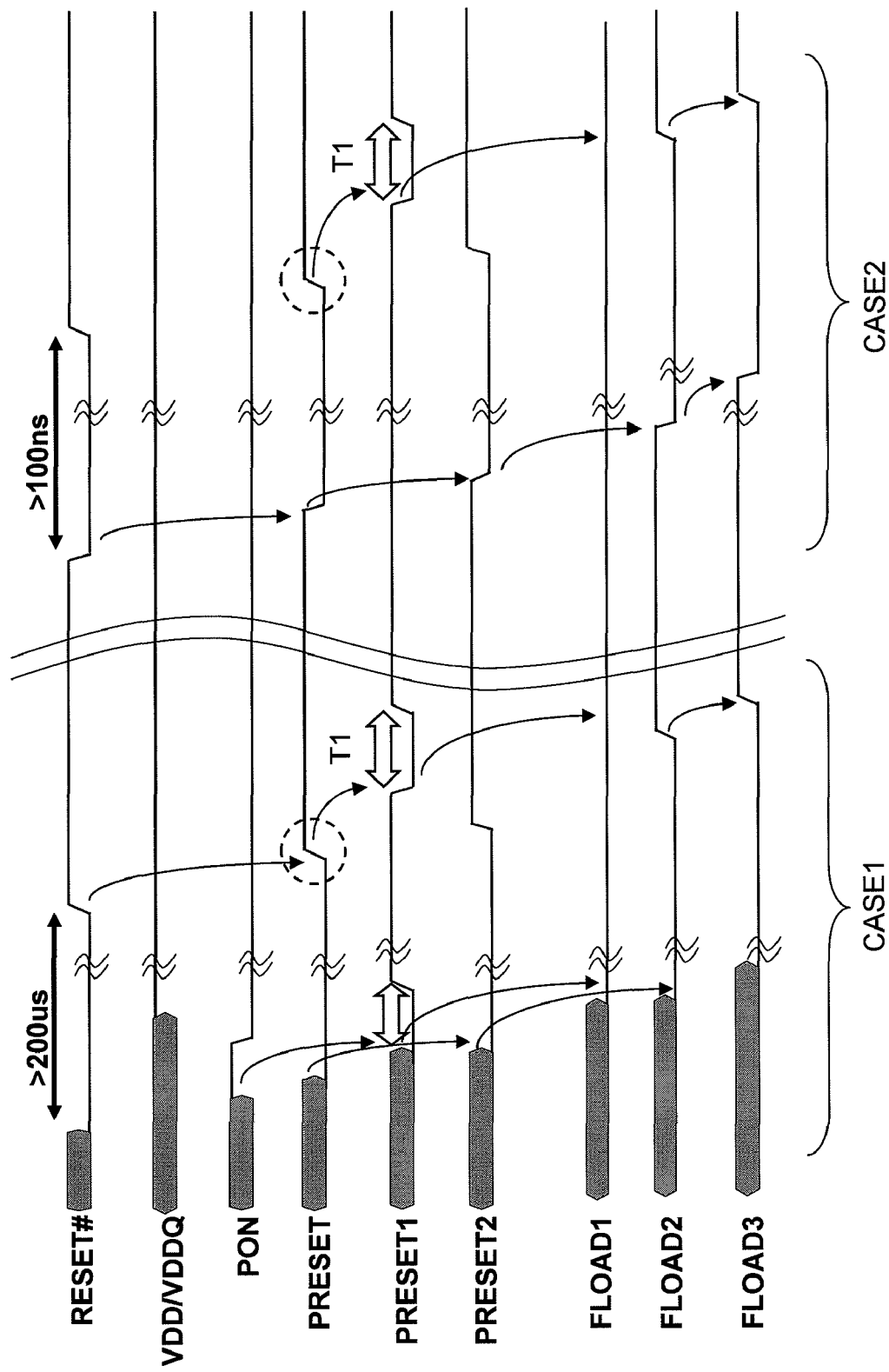
FIG. 12 is a timing chart for explaining an operation of the semiconductor device according to the second embodiment.

FIG. 12 is a timing chart for explaining an operation of the semiconductor device 10*a* according to the second embodiment.

As shown in FIG. 12, in the second embodiment, the internal reset signal PRESET1 is activated to the Low level not only when the external reset signal RESET# makes transition to the High level but also when the logical level of the power-on reset signal PON is changed to the High level. When the external reset signal RESET# is activated at the time of powering on the semiconductor device 10*a*, the transistor Tr1 is switched ON for the activation period of the power-on reset signal PON, and the memory content of the fuse element 31 is latched in the latch circuit L2 included in the read-out circuit RD. As a result, the state of the latch circuit L2 included in the read-out circuit RD is promptly changed from the unstable state to the state that the memory content of the fuse element 31 is held, making it possible to secure a more stable operation.

In the second embodiment, because the memory content of the fuse element 31 is read out in response to the power-on reset signal PON, it is not essentially required to activate the internal reset signal PRESET1 in response to the transition of the external reset signal RESET# at the time of powering on the semiconductor device 10*a*. However, the power-on reset signal PON is has a certain level of instability, and in some cases, the power-on reset signal PON may not be generated even when the power is turned on. Considering this kind of situation, in the second embodiment, even after the memory content of the fuse element 31 is read out in response to the power-on reset signal PON, the read-out operation is performed again in response to the transition of the external reset signal RESET#, to ensure a reliable read-out operation.

A semiconductor device according to a third embodiment of the present invention is explained next.

The third embodiment is different from the second embodiment in that the timing control circuit 20*a* is replaced with a timing control circuit 20*b*. Therefore, a block diagram showing the entire configuration of the semiconductor device according to the third embodiment will be omitted.

Figure 13:
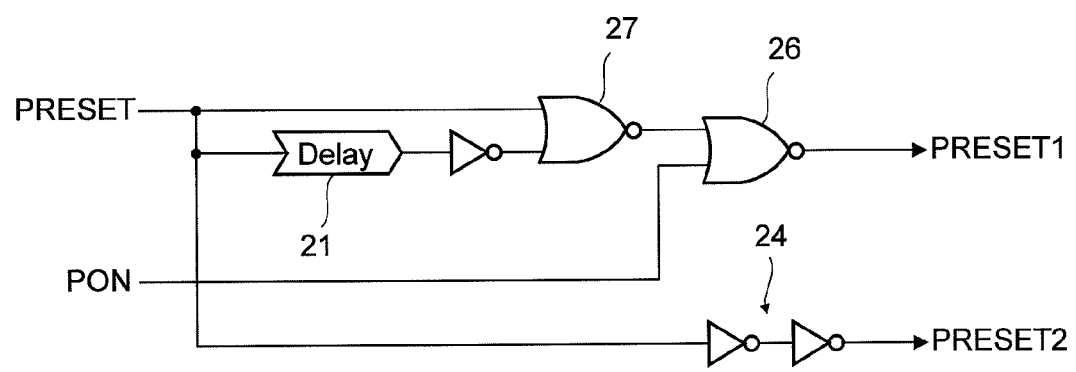
FIG. 13 is a circuit diagram of the timing control circuit that is employed in the semiconductor device according to the third embodiment.

FIG. 13 is a circuit diagram of the timing control circuit 20*b* that is employed in the semiconductor device according to the third embodiment.

As shown in FIG. 13, in the timing control circuit 20*b*, the AND circuit 25 shown in FIG. 11 is replaced with a NOR circuit 27. Other features of the timing control circuit 20*b* are the same as those of the timing control circuit 20*a* shown in FIG. 11.

Figure 14:
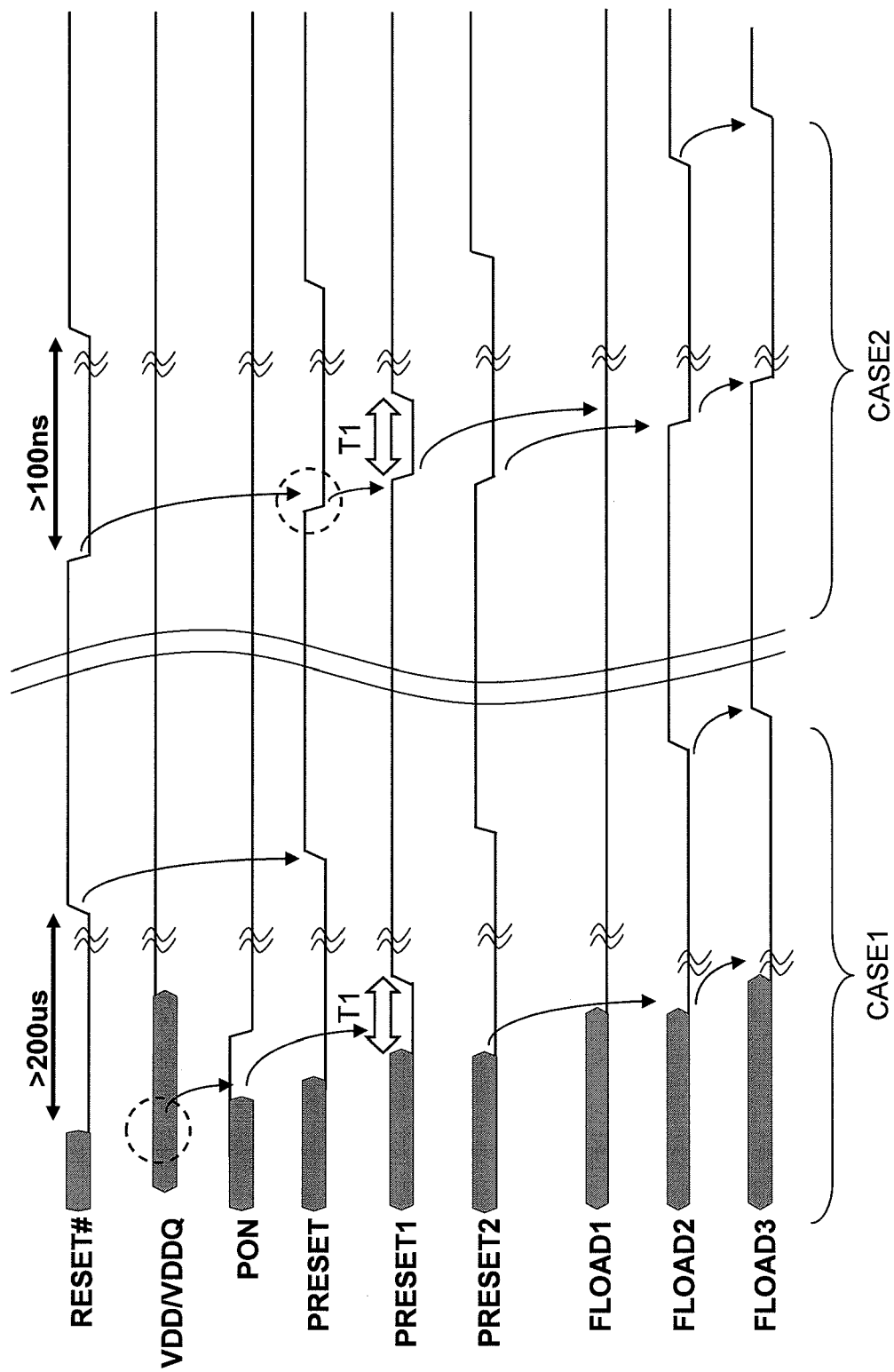
FIG. 14 is a timing chart for explaining an operation of the semiconductor device according to the third embodiment.

FIG. 14 is a timing chart for explaining an operation the semiconductor device according to the third embodiment.

As shown in FIG. 14, in the third embodiment, the internal reset signal PRESET1 is activated for the predetermined period T1 when the external reset signal RESET# makes transition to the Low level. That is, in the first and second embodiments, the internal reset signal PRESET1 is generated when the external reset signal RESET# makes transition from the activation state to the deactivation state; however, in the third embodiment, the internal reset signal PRESET1 is generated in response to transition of the external reset signal RESET# from the deactivation state to the activation state.

However, at the time of powering on the semiconductor device, the external reset signal RESET# does not make transition from the deactivation state to the activation state. That is, the external reset signal RESET# is changed from the unstable state to the activation state at the time of powering on the semiconductor device, and then it makes transition to the deactivation state. Therefore, in the third embodiment, the internal reset signal PRESET1 is activated in response to the power-on reset signal PON.

According to the third embodiment, because the reset of the latch circuit L1 and the read-out operation of the read-out circuit RD are performed in parallel, it is possible to reduce a time required for a series of operations.

A fourth embodiment of the present invention is explained next.

Figure 15:
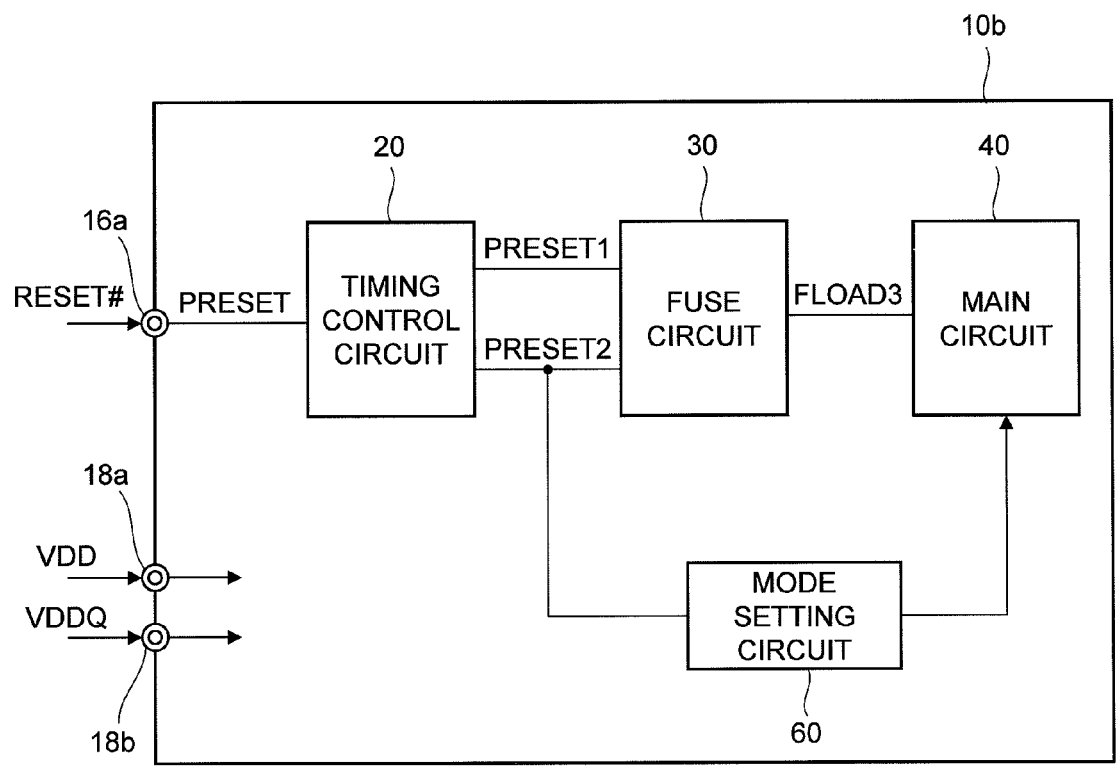
FIG. 15 is a block diagram of a semiconductor device according to the fourth embodiment.

FIG. 15 is a block diagram of a semiconductor device 10b according to the fourth embodiment.

As shown in FIG. 15, the fourth embodiment is different from the first embodiment in that the semiconductor device 10b further includes a mode setting circuit 60. Because other features of the semiconductor device 10b are the same as those of the semiconductor device 10, like reference numerals are denoted to like constituent elements and redundant explanations thereof will be omitted.

The mode setting circuit 60 is a register for designating an operation mode of the main circuit 40. That is, the operation mode of the main circuit 40 is designated by both the fuse circuit 30 and the mode setting circuit 60. The designation of the operation mode by the fuse circuit 30 is irreversible, which is determined at the stage of manufacturing the semiconductor device based on the specifications and the like. However, the designation of the operation mode by the mode setting circuit 60 is reversible, which can be changed by a user in an arbitrary manner. The mode setting circuit 60 is written at the time of resetting the semicondudtor device 10b. As an example, a so-called mode register is corresponding to the mode setting circuit 60.

As shown in FIG. 15, the internal reset signal PRESET2 is supplied to the mode setting circuit 60, so that the setting content of the mode setting circuit 60 is reset in response to the activation of the internal reset signal PRESET2. With this configuration, when the external reset signal RESET# is activated, not only the reading of information from the fuse circuit 30 is performed but also the reset of the mode setting circuit 60 is performed at the same time. As a result, the semiconductor device 10b can be completely reset.

A fifth embodiment of the present invention is explained below.

Figure 16:
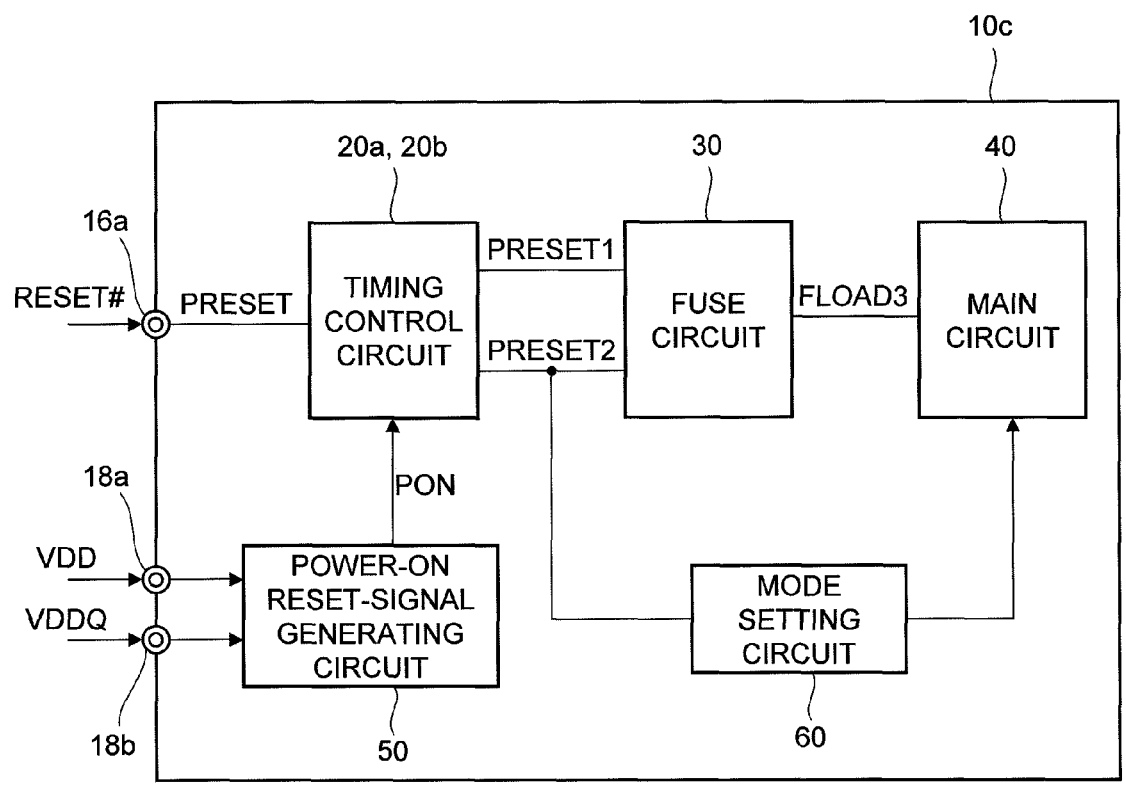
FIG. 16 is a block diagram of a semiconductor device according to the fifth embodiment.

FIG. 16 is a block diagram of a semiconductor device 10c according to the fifth embodiment.

As shown in FIG. 16, the fifth embodiment is different from the second or third embodiment in that the semiconductor device 10c further includes a mode setting circuit 60. The other features of the semiconductor device 10c are the same as those of the semiconductor device 10a according to the second or third embodiment. In the fifth embodiment, the setting content of the mode setting circuit 60 is reset in response to the activation of the internal reset signal PRESET2. With this configuration, when the external reset signal RESET# is activated, the semiconductor device 10c can be completely reset.

It is apparent that the present invention is not limited to the above embodiments, but may be modified and changed without departing from the scope and spirit of the invention.

For example, in the above embodiments, the fuse element 31 that can be blown by an irradiation of a laser beam is used as the nonvolatile memory element; however, the nonvolatile memory element is not limited to the laser fuse. The nonvolatile memory element can be a fuse element that can be disconnected by an application of a large current and can be an antifuse that can be irreversibly changed from a nonconductive state to a conductive state by an application of a high voltage. Furthermore, it can be a ROM element or a ROM circuit of variable types. Even when a ROM element or a ROM circuit is employed, it is not necessarily to be an element or a circuit that stores information therein in an irreversible manner, and, for instance, it can be an element or a circuit that stores information therein in a reversible manner, such as an EEPROM.

What is claimed is:

1. A semiconductor device comprising:
a timing control circuit producing first and second reset signals, the first reset signal taking an active level during the second reset signal taking an inactive level, and the second reset signal taking an active level during the first reset signal taking an inactive level;
an information storing element;
a read-out circuit coupled to the timing control circuit and the information storing element and activated in response to the active level of the first reset signal to read out information stored in the information storing element; and
an SR latch circuit including a set terminal supplied with an output from the read-out circuit and a reset terminal supplied with the second reset signal, the SR latch circuit being cleared in response to the active level of the second reset signal.

2. The device as claimed in claim 1, wherein the read-out circuit comprises an additional latch circuit that temporarily holds information read out from the information storing element and supplies the information to the set terminal of the SR latch circuit.

3. The device as claimed in claim 2, wherein the timing control circuit receives an original reset signal to produce the first and second reset signals.

4. The device as claimed in claim 3, wherein the timing control circuit comprises a one-shot pulse circuit which produces the first reset signal as a one-shot pulse in response to a change of the original reset signal from a first logic level to a second logic level.

5. The device as claimed in claim 3, wherein the timing control circuit comprises a delay circuit which produces the second reset signal by delaying the original reset.

6. The device as claimed in claim 3, wherein the timing control circuit comprises a one-shot pulse circuit which produces the first reset signal as a one-shot pulse in response to a change of the original reset signal from a first logic level to a second logic level, the timing control circuit further comprising a delay circuit which produces the second reset signal by delaying the original reset.

7. The device as claimed in claim 6, wherein the second logic level of the original reset signal corresponds to the active level of the second reset signal and the one-shot pulse takes the active level of the first reset signal.

8. A semiconductor device comprising:
a timing control circuit producing first and second reset signals, the first reset signal taking an active level during a first period of time, the second reset signal taking an active level during a second period of time;
an information storage element;

a read-out circuit coupled to the timing control circuit and the information storage element and activated in response to the active level of the first reset signal to read out information stored in the information storage element and produce an output signal related to the information; and a latch circuit including a first input terminal and a second input terminal provided independently of the first input terminal, the first input terminal being coupled to the read-out circuit to receive the output signal from the read-out circuit, the second input terminal being coupled to the timing control circuit to receive the second reset signal, the latch circuit being cleared in response to the active level of the second reset signal.

9. The device as claimed in claim 8, wherein the read-put circuit comprises an additional latch circuit that temporarily stores the information and produces the output signal.

10. The device as claimed in claim 9, wherein the first period is smaller than the second period.

11. The device as clamed in claim 10, wherein the first period appears while the second reset signal is taking an inactive level and the second period arrears while the first reset signal is taking an inactive level.

12. The device as claimed in claim 9, wherein the at least a part of the first period overlaps with at least a part of the second period.

13. The device as claimed in claim 9, wherein the timing control circuit produces the first and second reset signals in response to an original reset signal, the original reset signal changing between an active level and an inactive level.

14. The device as claimed in claim 13, wherein the first reset signal is produced in response to a change from one of the active and inactive levels to the other of the active and inactive levels of the original reset signal, and the second period is approximately equal to a period time when the original reset signal is taking one of the active and inactive levels.

15. The device as claimed in claim 9, further comprising a power-on circuit that produces a power-on signal in response to switch-on of a power supply voltage to the device, the timing control circuit receiving the power-on signal to produce the first reset signal.

16. A semiconductor device comprising:
a timing control circuit producing first and second reset signals, the first reset signal taking an active level during a first period of time, the second reset signal taking an active level during a second period of time;
a storage circuit comprising,
an information storage element,
a read-out circuit coupled to the timing control circuit and the information storage element and activated in response to the active level of the first reset signal to read out information stored in the information storage element,
a first latch circuit temporarily storing the information and producing an output signal related to the information, and
a second latch circuit including a first input terminal and a second input terminal provided independently of the first input terminal, the first input terminal being coupled to the first latch circuit to receive the output signal, the second input terminal being coupled to the timing control circuit to receive the second reset signal, the second latch circuit being cleared in response to the active level of the second reset signal; and
a main circuit performing a circuit operation in response to an output of the latch circuit.

17. The device as claimed in claim 16, wherein the information storage element comprises a fuse, and the output signal indicates that the fuse is in one of a blown state and a non-blown state.

18. The device as claimed in claim 16, wherein the main circuit comprises a memory circuit and performs a data read and write operations on the memory circuit in response to the output from the latch circuit.

19. The device as claimed in claim 17, wherein the main circuit comprises a memory circuit and performs a data read and write operations on the memory circuit in response to the output from the latch circuit.

* * * * *